(12) United States Patent
Ueda

(10) Patent No.: US 7,511,992 B2
(45) Date of Patent: Mar. 31, 2009

(54) MAGNETIC MEMORY DEVICE

(75) Inventor: Yoshihiro Ueda, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 7 days.

(21) Appl. No.: 11/937,058

(22) Filed: Nov. 8, 2007

(65) Prior Publication Data
US 2008/0112216 A1    May 15, 2008

(30) Foreign Application Priority Data
Nov. 9, 2006    (JP)    .............................. 2006-304351

(51) Int. Cl.
*G11C 11/15*    (2006.01)
(52) U.S. Cl. ...................... 365/158; 365/173
(58) Field of Classification Search .................... 365/66
See application file for complete search history.

(56) References Cited

U.S. PATENT DOCUMENTS 5,695,864 A    12/1997    Slonczewski 6,600,690 B1    7/2003    Nahas et al.
7,116,598 B2 *    10/2006    Shimizu et al. .......... 365/210.1

* cited by examiner

*Primary Examiner*—Tan T. Nguyen
(74) *Attorney, Agent, or Firm*—Oblon, Spivak, McClelland, Maier & Neustadt, P.C.

(57) ABSTRACT

There is provided a magnetic memory device including a first magnetoresistive element which takes a high-resistance-state when receiving a write current in a first direction, takes a low-resistance-state having a resistance value lower than that in the high-resistance-state when receiving a write current in a second direction opposite to the first direction, and receives a read current in a read operation, a second magnetoresistive element which takes one of the high-resistance and low-resistance-states in accordance with a magnetization state thereof, is fixed to the low-resistance-state when a direction of the read current is the same as the first direction, and is fixed to the high-resistance-state when the direction of the read current is the same as the second direction, and a control circuit which is connected to the first and second elements, and makes a read voltage applied to the first element equal to that applied to the second element.

12 Claims, 5 Drawing Sheets

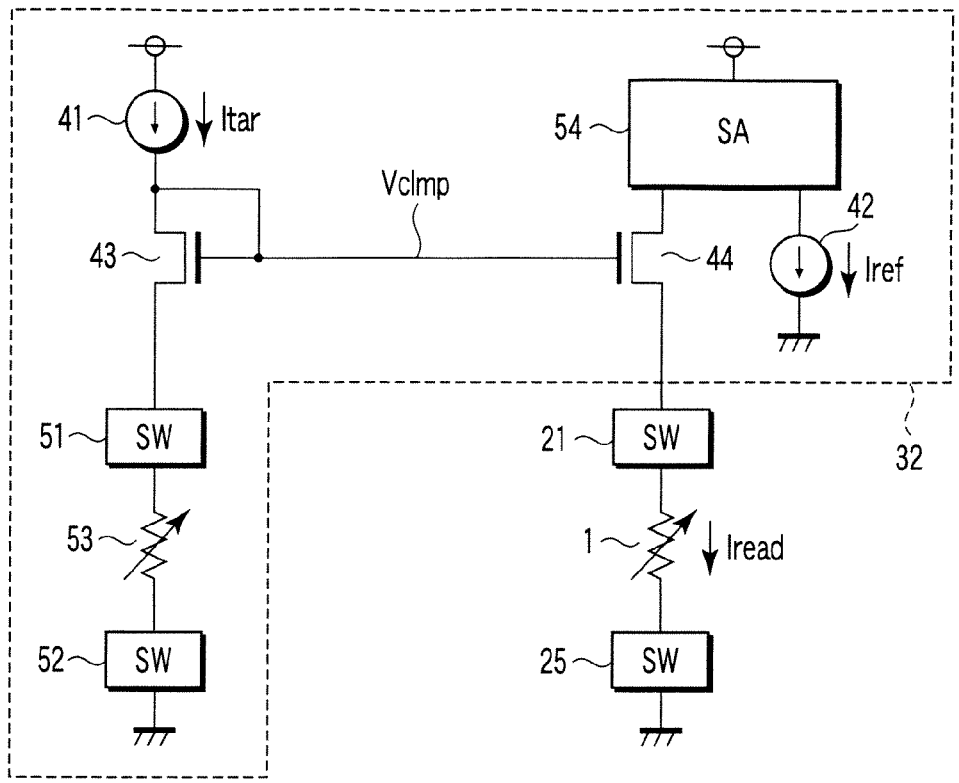
F I G. 4
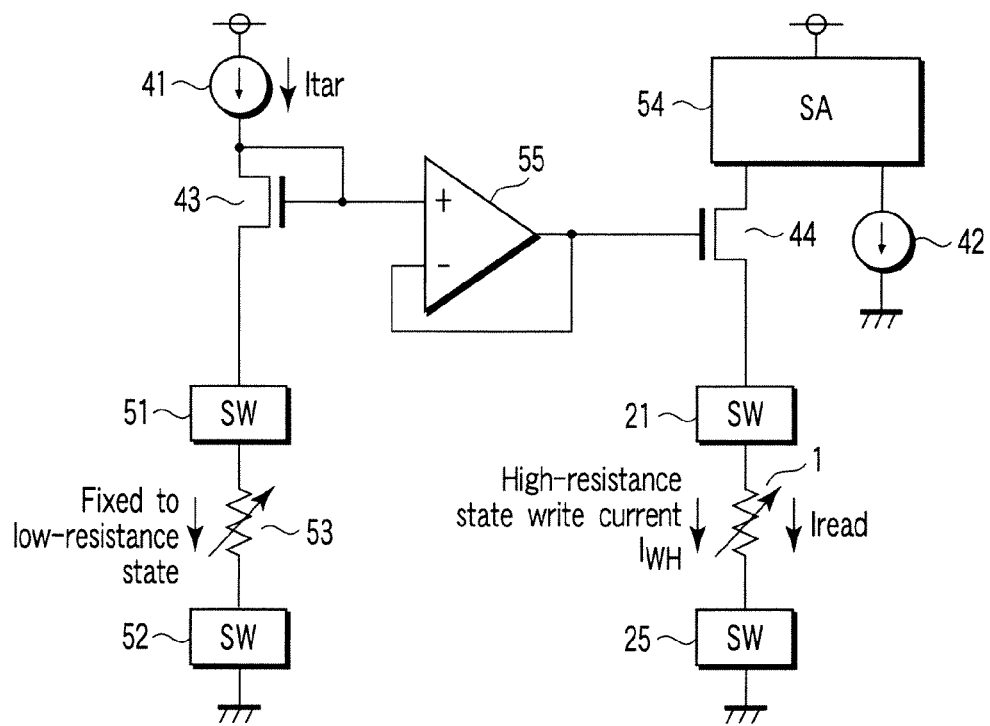
F I G. 5

MAGNETIC MEMORY DEVICE

CROSS-REFERENCE TO RELATED APPLICATIONS

This application is based upon and claims the benefit of priority from prior Japanese Patent Application No. 2006-304351, filed Nov. 9, 2006, the entire contents of which are incorporated herein by reference.

BACKGROUND OF THE INVENTION

1. Field of the Invention

The present invention relates to a magnetic memory device, e.g., a read-system circuit of a magnetic memory device.

2. Description of the Related Art

A magnetoresistive element is known as a nonvolatile memory element. The magnetoresistive element includes a free layer and fixed layer made of a magnetic material and a nonmagnetic layer sandwiched between them, and takes different resistance states in accordance with the direction of magnetization in the free layer. A magnetic random access memory (MRAM) is a magnetic memory device that stores data by using this resistance state difference.

As a data write method, a so-called spin injection write method has been proposed (U.S. Pat. No. 5,695,864) in addition to the conventional, so-called magnetic field write method using a current magnetic field.

In spin injection write, the current of electrons spin-polarized by the magnetic moment in the fixed layer of the magnetoresistive element is supplied to its free layer. Since the direction of magnetization in the free layer changes in accordance with the direction of this electron current, specific data is written in the magnetoresistive element. Unlike the magnetic field write method, this write method can exert a direct action on the magnetoresistive element. Accordingly, no write error occurs in adjacent memory cells. Another advantage is that the amount of electric current required for write reduces as the cell size decreases.

Data read is performed by supplying a read current to the magnetoresistive element, converting the resistance value into a current value or voltage value, and comparing this current value or voltage value with a reference value.

The magnetoresistive element uses the same data holding mechanism for the magnetic field write method and spin injection write method. Therefore, a partial peripheral circuit configuration can be shared by MRAMs using the two write methods. However, the two write methods require some different peripheral circuits because the write principles are different.

One peripheral circuit required to have an optimum configuration in accordance with the write method is a read-system circuit. The two write methods use the same principle for data read. Since the write principles are different, however, a read-system circuit used together with the magnetic field write method cannot be simply used together with the spin injection write method. Accordingly, demands have arisen for implementing a read-system circuit suited to the spin injection method.

BRIEF SUMMARY OF THE INVENTION

According to an aspect of the invention, there is provided a magnetic memory device comprising: a first magnetoresistive element which takes a high-resistance state when receiving a write current in a first direction, takes a low-resistance state having a resistance value lower than a resistance value in the high-resistance state when receiving a write current in a second direction opposite to the first direction, and receives a read current in a read operation; a second magnetoresistive element which takes one of the high-resistance state and the low-resistance state in accordance with a magnetization state thereof, is fixed to the low-resistance state when a direction of the read current is the same as the first direction, and is fixed to the high-resistance state when the direction of the read current is the same as the second direction; and a control circuit which is connected to the first magnetoresistive element and the second magnetoresistive element, and makes a read voltage applied to the first magnetoresistive element equal to a read voltage applied to the second magnetoresistive element.

According to another aspect of the invention, there is provided a magnetic memory device comprising: a first MOSFET having one terminal which receives a constant current, and a gate terminal connected to the one terminal; a second MOSFET having one terminal connected to a sense amplifier, and a gate terminal which receives the same potential as a potential at the gate terminal of the first MOSFET; a first magnetoresistive element which is connected the other terminal of the second MOSFET, takes a high-resistance state when receiving a write current in a first direction, takes a low-resistance state having a resistance value lower than a resistance value in the high-resistance state when receiving a write current in a second direction opposite to the first direction, and receives a read current in a read operation; and a second magnetoresistive element which is connected to the other terminal of the first MOSFET, takes one of the high-resistance state and the low-resistance state in accordance with a magnetization state thereof, is fixed to the low-resistance state when a direction of the read current is the same as the first direction, and is fixed to the high-resistance state when the direction of the read current is the same as the second direction.

According to another aspect of the invention, there is provided a magnetic memory device comprising: an operational amplifier having a non-inverting input terminal which receives a constant voltage; a first MOSFET connected to an inverting input terminal of the operational amplifier, and having a gate connected to an output terminal of the operational amplifier; a second MOSFET having one terminal connected to a sense amplifier, and a gate terminal connected to the output terminal of the operational amplifier; a first magnetoresistive element which is connected the other terminal of the second MOSFET, takes a high-resistance state when receiving a write current in a first direction, takes a low-resistance state having a resistance value lower than a resistance value in the high-resistance state when receiving a write current in a second direction opposite to the first direction, and receives a read current in a read operation; and a second magnetoresistive element which is connected to the other terminal of the first MOSFET, takes one of the high-resistance state and the low-resistance state in accordance with a magnetization state thereof, is fixed to the low-resistance state when a direction of the read current is the same as the first direction, and is fixed to the high-resistance state when the direction of the read current is the same as the second direction.

BRIEF DESCRIPTION OF THE SEVERAL VIEWS OF THE DRAWING

FIG. 4 is another circuit diagram related to read of the first embodiment;

FIG. 5 is a diagram showing an example of fixing of the resistance state of a replica magnetoresistive element according to the first embodiment;

DETAILED DESCRIPTION OF THE INVENTION

Figure 1:
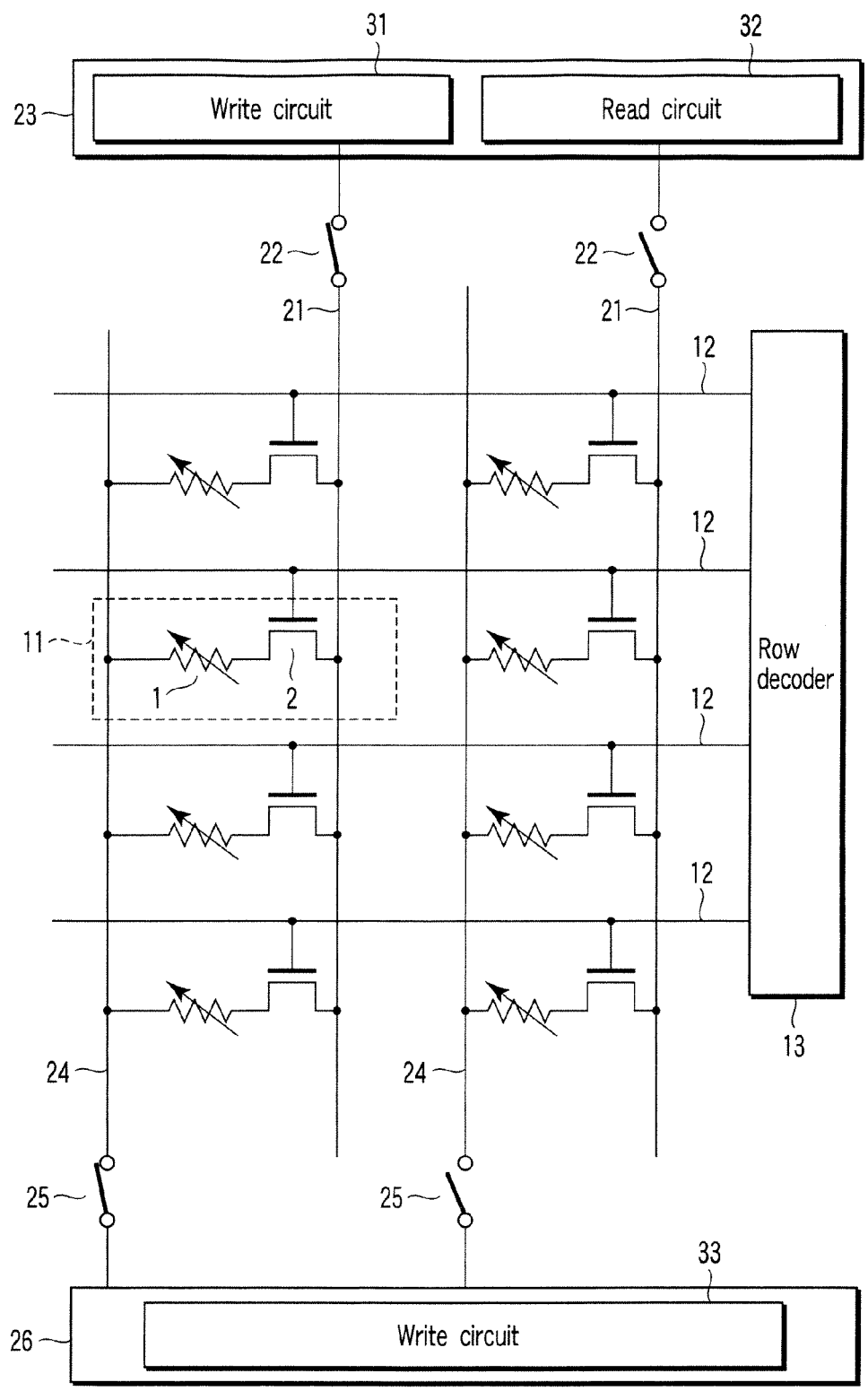
FIG. 1 is a circuit diagram of a magnetic memory device according to the first embodiment.

Embodiments will be explained below with reference to the accompanying drawings.

In a read-system circuit suited to the spin injection write method, the value of a write current supplied to a magnetoresistive element when writing data in it and the value of a read current supplied to the magnetoresistive element when reading out data from it are set to satisfy the requirements described below.

When writing data in a magnetoresistive element by the spin injection write method, bidirectional write currents flowing through the surfaces (film surfaces) where a plurality of layers forming the magnetoresistive element oppose each other are supplied to the magnetoresistive element. When reading out data held in the magnetoresistive element, a read current flowing in the same direction as a given one of the two directions in which the write currents flow is supplied to the magnetoresistive element.

Data having one of two values is written when an electric current is supplied downward through the film surfaces, and data having the other value is written when an electric current is supplied upward through the film surfaces. For example, a write current flowing downward through the film surfaces sets a high-resistance state (writes, e.g., data "1"), and a write current flowing upward through the film surfaces sets a low-resistance state (writes, e.g., data "0").

In the stage of design, the value of the write current is set at a certain value. Ideally, therefore, data is written in all magnetoresistive elements by supplying this write current. In reality, however, the shapes of magnetoresistive elements, the states of layers forming the magnetoresistive elements, and the like are unavoidably different between the magnetoresistive elements. Therefore, a write current changes from one magnetoresistive element to another, and a write current value corresponding to a magnetoresistive element forms a normal distribution around one value set during design.

The read current is set smaller than the write current in order to prevent data held by the magnetoresistive element from being rewritten (disturbed) by mistake by the read current.

As described above, the write current value practically changes from one magnetoresistive element to another. Accordingly, the read current value is set much smaller than the write current value of a magnetoresistive element having the characteristic that data is written by a minimum write current value. However, the read current also varies from the set value in accordance with the temperature at which an MRAM is used, the characteristics of a read-system circuit, and the like. To avoid disturbance caused by the varied read current, therefore, a technique capable of decreasing the read current variation itself is desirable. That is, a technique capable of generating a read current that does not largely shift from the set value is desirable.

The embodiments of the present invention configured on the basis of the above findings will be explained below with reference to the accompanying drawing. Note that in the following explanation, the same reference numerals denote constituent elements having almost the same functions and arrangements, and a repetitive explanation will be made only when necessary.

FIG. 1 is a circuit diagram showing the main parts of a magnetic memory device according to the first embodiment of the present invention. As shown in FIG. 1, memory cells 11 each including a magnetoresistive element 1 and selection transistor 2 connected in series are formed. The selection transistor 2 is, e.g., an n-type MOSFET (Metal Oxide Semiconductor Field Effect Transistor).

The magnetoresistive element 1 takes a low-resistance state or high-resistance state when the current of spin-polarized electrons (a spin-polarized electric current) is supplied from one terminal to the other of the two terminals or vice versa. The magnetoresistive element 1 can store binary data by making one of the two resistance states correspond to data "0", and the other correspond to data "1". The arrangement of the magnetoresistive element 1 will be explained in more detail later.

A memory cell array is formed by arranging the memory cells 11 in, e.g., a matrix. The magnetic memory device can supply, to the magnetoresistive element 1 of a given memory cell 11, an electric current in a direction in which the magnetoresistive element 1 is set in the low-resistance state, and an electric current in a direction in which the magnetoresistive element 1 is set in the high-resistance state. Various configurations can supply such electric currents, so the present invention is not limited to any of these configurations. An example will be explained below.

For example, as shown in FIG. 1, the gate electrodes of the selection transistors 2 in the same row (or column) are connected to the same word line 12. The word lines 12 of the individual rows are connected to a row decoder 13. The row decoder 13 specifies a word line 12 by an address signal supplied from outside the magnetic memory device. When the selected word line 12 is activated, the selection transistors 2 connected to the selected word line 12 are turned on.

One terminal (e.g., the right terminal) of each of the memory cells 11 in the same column (or row) is connected to a connecting line 21. Each connecting line 21 is connected to a peripheral circuit 23 via a switching circuit 22 such as a transistor.

The switching circuit 22 is turned on or off in accordance with a signal corresponding to an address signal that specifies the memory cell 11 as an object of write or read. When the switching circuit 22 connected to the connecting line 21 connected to the memory cell 11 as an object is turned on, the peripheral circuit 23 is electrically connected to the memory cell 11 as an object of write or read.

Similarly, the other terminal (e.g., the left terminal) of each of the memory cells in the same column (or row) is connected to a connecting line 24. Each connecting line 24 is connected to a peripheral circuit 26 via a switching circuit 25 such as a transistor.

The switching circuit 25 is turned on or off in accordance with a signal corresponding to an address signal. When the switching circuit 25 connected to the connecting line 24 connected to the memory cell 11 as an object is turned on, the peripheral circuit 26 is electrically connected to the memory cell 11 as an object of write or read.

The peripheral circuit 23 includes, e.g., a write circuit 31 and read circuit 32. The peripheral circuit 26 includes, e.g., a write circuit 33.

The write circuits 31 and 33 each include a current source/sink circuit. The current source/sink circuit has a function of supplying an electric current to the connected connecting line 21 or 24, and a function of extracting an electric current from the connecting line 21 or 24.

When writing data in a certain memory cell 11, the selection transistor 2 connected to the memory cell 11 is turned on, and the switching circuits 22 and 25 connected to the connecting lines 21 and 24 of a memory cell column including the memory cell 11 are turned on. Of the current source/sink circuits (write circuits 31 and 33), one circuit corresponding to the write data functions as a current source circuit, and the other functions as a current sink circuit. Consequently, the write current flows between the write circuits 31 and 33 via the switching circuit 22, connecting line 21, memory cell 11, connecting line 24, and switching circuit 25.

In the example shown in FIG. 1, the write circuits 31 and 33 are arranged at the two ends of the memory cell array. However, the present invention is not limited to this example, and the write circuits 31 and 33 can be implemented in any form as long as bidirectional electric currents can be supplied to the memory cell 11 as described above. For example, both of a pair of write circuits 31 and 33 may also be arranged in the upper or lower end of the memory cell array. In this arrangement, the switching circuits 22 and 25 are also arranged in the upper or lower end of the memory cell array where the corresponding write circuits 32 and 33 are arranged.

As will be described in detail later, the read circuit 32 has at least a supply circuit for supplying the read current, and a sense amplifier. When reading out data, the supply circuit supplies, to the magnetoresistive element 1, an electric current having a magnitude with which the magnetoresistive element 1 can detect the held data in accordance with the state of magnetization. The sense amplifier determines the resistance state by supplying an electric current to the magnetoresistive element 1.

In the example shown in FIG. 1, the read circuit 32 is connected to the upper end of the connecting line 21. However, the present invention is not limited to this connection. That is, the read circuit 32 can be implemented in any form as long as the resistance state can be determined by supplying the read current to the magnetoresistive element 1. For example, the read circuit 32 may also be connected to the lower end of the connecting line 21, or to the connecting line 24. A practical configuration of the read circuit 32 will be described in detail later.

Figure 2:
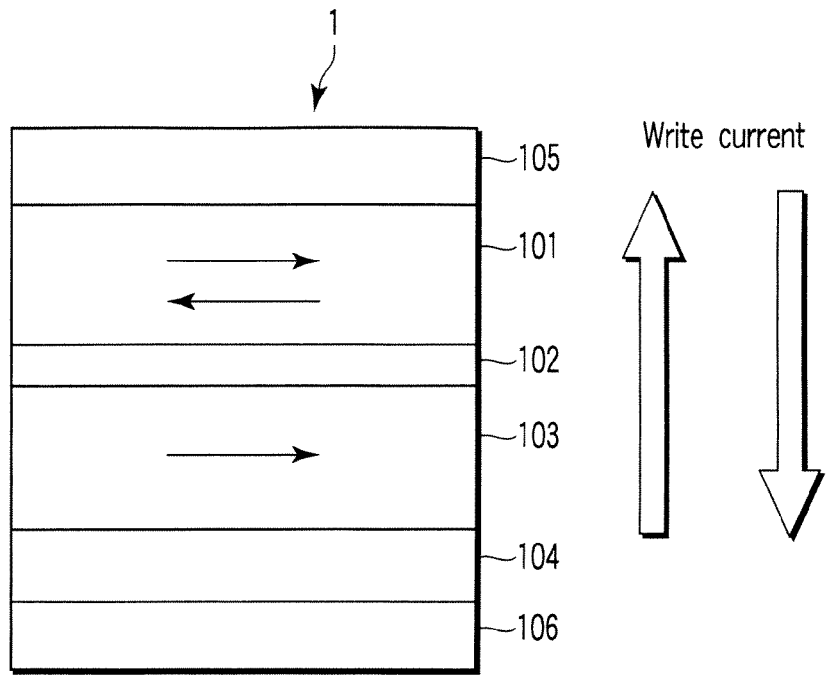
FIG. 2 is a sectional view of a magnetoresistive element of the magnetic memory device of the first embodiment.

The magnetoresistive element 1 will be explained below with reference to FIG. 2. FIG. 2 is a sectional view of a magnetoresistive element applicable to this embodiment. As the most typical example, as shown in FIG. 2, the magnetoresistive element 1 includes at least a fixed layer 103 made of a ferromagnetic material, an interlayer 102 made of a nonmagnetic material, and a free layer (recording layer) 101 made of a ferromagnetic material, and these layers are sequentially stacked.

Note that the free layer 101 and (or) the fixed layer 103 can also have a stacked structure including a plurality of sublayers. Magnetization in the fixed layer 103 is fixed along the film surface. An arrow in the fixed layer 103 indicates the magnetization direction in the fixed layer 103. Magnetization can be fixed by, e.g., forming an antiferromagnetic layer 104 on the surface of the fixed layer 103 away from the interlayer 102.

On the other hand, no such fixing mechanism as above is formed for magnetization in the free layer 101. Accordingly, the magnetization direction (indicated by an arrow in the free layer 101) in the free layer 101 is variable along the film surface.

The interlayer 102 is made of, e.g., a nonmagnetic metal, nonmagnetic semiconductor, or insulating film.

It is also possible to form electrodes 105 and 106 on the surface of the free layer 101 away from the nonmagnetic layer 102, and on the surface of the antiferromagnetic layer 104 away from the fixed layer 103, respectively.

The magnetization in the free layer 101 which points in a direction antiparallel to the magnetization direction in the fixed layer 103 is reversed to point in a direction parallel to the magnetization direction in the fixed layer 103 by supplying an electron current from the fixed layer 103 to the free layer 101. Generally, many electrons in an electron current passing through a certain magnetic material have spins parallel to the magnetization direction in the magnetic material. Therefore, many electrons in the electron current passing through the fixed layer 103 have spins parallel to the magnetization direction in the fixed layer 103. This electron current makes a principal contribution to the torque acting on the magnetization in the free layer 101. Note that the remaining electrons in the electron current have spins antiparallel to the magnetization direction in the fixed layer 103.

On the other hand, the magnetization in the free layer 101 which points in the direction parallel to the magnetization direction in the fixed layer 103 is reversed to point in the direction antiparallel to the magnetization direction in the fixed layer 103 by supplying an electron current from the free layer 101 to the fixed layer 103. This electron current passes through the free layer 101, and many electrons having spins antiparallel to the magnetization direction in the fixed layer 103 return to the free layer 101 as they are reflected by the fixed layer 103. These electrons flowing into the free layer 101 again and having spins antiparallel to the magnetization direction in the fixed layer 103 make a principal contribution to the torque acting on the magnetization in the free layer 101. Note that a few of the electrons passing through the free layer 101 and having spins antiparallel to the magnetization direction in the fixed layer 103 pass through the fixed layer 103.

The magnetoresistive element 1 shows a low resistance when the magnetization in the fixed layer 103 and the magnetization in the free layer 101 are parallel, and shows a high resistance when they are antiparallel. The resistance states and held data can be freely associated.

As the ferromagnetic material of the free layer 101 and fixed layer 103, it is possible to use, e.g., Co, Fe, Ni, or an alloy containing any of these metals. As the material of the antiferromagnetic layer 104, it is possible to use, e.g., Fe—Mn, Pt—Mn, Pt—Cr—Mn, Ni—Mn, Pd—Mn, NiO, $Fe_2O_3$, or a magnetic semiconductor.

When a nonmagnetic metal is used as the interlayer 102, it is possible to use any of Au, Cu, Cr, Zn, Ga, Nb, Mo, Ru, Pd, Ag, Hf, Ta, W, Pt, and Bi, or an alloy containing at least one of these metals. When the interlayer 102 is allowed to function as a tunnel barrier layer, $Al_2O_3$, $SiO_2$, MgO, AlN, or the like can be used.

FIG. 2 shows an example in which the magnetization directions in the fixed layer 103 and free layer 101 are parallel to the film surfaces. However, the present invention is not limited to this example, and these magnetization directions may also be perpendicular to the film surfaces.

Figure 3:
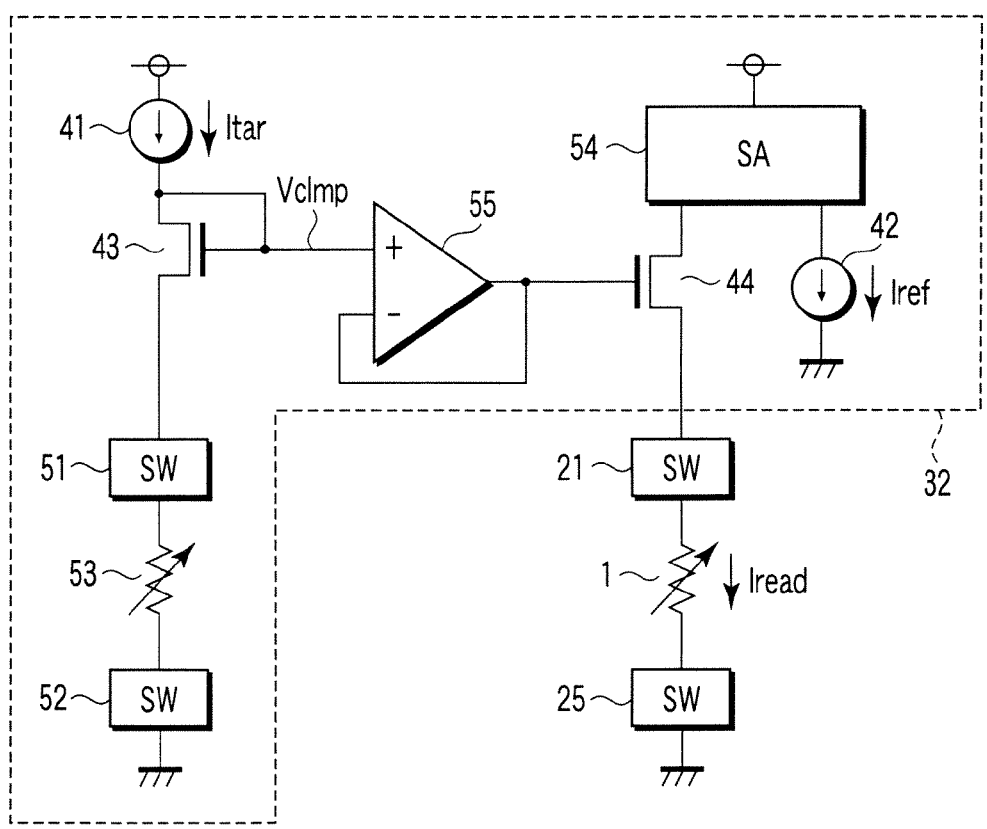
FIG. 3 is a circuit diagram related to read of the first embodiment.

The read circuit 32 will be explained below with reference to FIG. 3. FIG. 3 shows the configuration of a circuit related to read of the first embodiment. More specifically, FIG. 3 shows elements pertaining to read of one given memory cell 11.

As shown in FIG. 3, the read circuit 32 includes constant-current circuits 41 and 42, n-type MOSFETs 43 and 44, switching circuits 51 and 52, a replica magnetoresistive element 53, a sensor amplifier 54, an operational amplifier 55, and the like. The constant-current circuit 41, transistor 43, and replica magnetoresistive element 53 control the value of the read current supplied to the magnetoresistive element 1.

The constant-current circuit 41 supplies a target read current Itar. The target read current Itar is set at a certain value much lower than the write current. More specifically, the target read current Itar is smaller than a write current corresponding to one of all the magnetoresistive elements 11, in which the smallest write current reverses the magnetization state (reverses the magnetization in the free layer 101).

The constant-current circuit 41 is connected to one terminal (the drain terminal) of the transistor 43. This terminal of the transistor 43 is also connected to its own gate terminal. The other terminal (source terminal) of the transistor 43 is connected to one terminal of the switching circuit 51. The switching circuit 51 is, e.g., a transistor.

The other terminal of the switching circuit 51 is connected to one terminal of the replica magnetoresistive element 53. The replica magnetoresistive element 53 is formed in the same step as that of the magnetoresistive element 1 of the memory cell 11 at the same time, so as to have the same shape as that of the magnetoresistive element 1. That is, the replica magnetoresistive element 53 has the same arrangement as that of the magnetoresistive element 1, i.e., has at least a free layer 101, a fixed layer 103, and an interlayer 102 sandwiched between the free layer 101 and fixed layer 103. Accordingly, the magnetoresistive element 1 of the memory cell 11 and the replica magnetoresistive element 53 have the same characteristics in principle. That is, the two magnetoresistive elements have the same resistance values in the low-resistance state and high-resistance state, if the differences between the characteristics resulting from, e.g., variations in fabrication steps are not taken into consideration. Even when the variations in characteristics are taken into account, practically the same resistance values are obtained.

The magnetization state (resistance state) of the replica magnetoresistive element 53 is fixed in accordance with the direction in which the read current flows through the magnetoresistive element 1. The rules of fixing will be described in detail later.

Note that it is also possible to prevent the change in resistance state of the replica magnetoresistive element 53 by supplying an electric current to the replica magnetoresistive element 53 in a direction in which no magnetization reversal occurs in the free layer 101.

The other terminal of the replica magnetoresistive element 53 is grounded (connected to a common potential terminal) via the switching circuit 52 such as a transistor.

The sense amplifier 54 is connected to the constant-current circuit 42. The constant-current circuit 42 supplies a reference current Iref having a constant value. The reference current Iref is compared with a read current Iread flowing through the magnetoresistive element 1. The resistance state of the magnetoresistive element 1 and hence data held in it are determined on the basis of the comparison result.

The sense amplifier 54 is also connected to one terminal (the drain terminal) of the transistor 44. The sense amplifier 54 amplifies a voltage obtained by the comparison of the read current Iread with the reference current Iref.

The other terminal (source terminal) of the transistor 44 is connected to one terminal of the magnetoresistive element 1 via the switching circuit 21. The other terminal of the magnetoresistive element 1 is grounded via the switching circuit 25. Note that the selection transistor 2 for the magnetoresistive element 1 shown in FIG. 3 is omitted from FIG. 3 because the two terminals of the selection transistor 2 are electrically connected when reading out data from the magnetoresistive element 1. The transistor 44 has the same current drivability as that of the transistor 43.

The same potential as the potential (Vclmp) at the gate terminal of the transistor 43 is applied to the gate terminal of the transistor 44. As the simplest method, as shown in FIG. 4, the gate terminals of the transistors 43 and 44 are electrically connected. However, as shown in FIG. 3, the operational amplifier 55 can be formed between the gate terminals of the transistors 43 and 44. The operational amplifier 55 charges the potential at the gate terminal of the transistor 44, thereby making the potential equal to that at the gate terminal of the transistor 43. Therefore, the change in potential at the gate terminal of the transistor 43 is transmitted to the potential at the gate terminal of the transistor 44 within a time shorter than that when there is no operational amplifier 55.

The gate terminal of the transistor 43 is connected to the non-inverting input terminal of the operational amplifier 55. The output terminal of the operational amplifier 55 is connected to its own inverting input terminal, and to the gate terminal of the transistor 44.

The rules for fixing the magnetization direction in the replica magnetoresistive element 53 will now be explained with reference to FIGS. 3, 5, and 6. In the circuit shown in FIG. 3, the constant-current circuit 41, transistor 43, replica magnetoresistive element 53, transistor 44, and magnetoresistive element 1 form a current mirror circuit. The switching circuits 51, 52, 21, and 25 have functions of selecting a predetermined memory cell 1 and supplying the read current Iread when reading out data, and do not contribute to the current mirror operation. Since the switching circuits 51, 52, 21, and 25 are ON, the following explanation will not particularly mention them.

In the magnetic memory device according to this embodiment, the magnetization direction in the replica magnetoresistive element 53 is fixed by taking account of the two characteristic features of a spin injection write type magnetic memory device to be described below. One is that the read current can generate disturbance as briefly mentioned above.

The flowing direction of the read current Iread can match either of the two flowing directions of the write current. In the following explanation, for example, assume that the flowing direction of the read current Iread matches the direction of the write current (low-resistance write current) that sets the magnetoresistive element 1 in the high-resistance state. That is, the write current flowing downward in FIG. 3 sets the magnetoresistive element 1 in the low-resistance state, and the write current flowing upward in FIG. 3 sets the magnetoresistive element 1 in the high-resistance state. Assume that the magnetoresistive element 1 is set in the low-resistance state.

Under the circumstance, the resistance state of the magnetoresistive element 1 as an object of read reverses (disturbance occurs) if the read current Iread fluctuates from the target read current Itar for some reason and exceeds the write current value for the magnetoresistive element 1. On the other hand, when the magnetoresistive element 1 is set in the high-resistance state, the resistance state of the magnetoresistive element 1 does not reverse in accordance with the principle of magnetization reversal in the free layer 101, even if the read current Iread fluctuates and exceeds the write current value. That is, when the read current Iread is supplied to the magnetoresistive element 1 set in the resistance state opposite to that set by the write current in the same direction as that of the read current Iread, the resistance state of the magnetoresistive element 1 may reverse.

This phenomenon similarly occurs when the flowing direction of the read current Iread matches the flowing direction of the write current that sets the magnetoresistive element 1 in the high-resistance state.

The second characteristic feature will be explained below. In the current mirror circuit described above, when the values of the two resistors connected to the source terminals are equal, an electric current having the same magnitude as that of an electric current flowing through one transistor flows through the other transistor. In other words, if the values of the two resistors are different, the electric currents flowing through the two transistors are different.

The magnetoresistive element 1 takes one of the high-resistance state and low-resistance state in accordance with the magnetization state of the free layer 101. On the other hand, the replica magnetoresistive element 53 is fixed to one of the low-resistance state and high-resistance state. Accordingly, when the resistance states of the replica magnetoresistive element 53 and magnetoresistive element 1 are the same (when both the resistance states are the high-resistance state or low-resistance state), the read current Iread is (practically) equal to the target read current Itar. That is, the read current Iread can be easily controlled to the same value as that of the target read current Itar.

On the other hand, when the resistance states of the replica magnetoresistive element 53 and magnetoresistive element 1 are different, the read current Iread is different from the target read current Itar. That is, it is difficult to control the read current Iread to the same value as that of the target read current Itar. If the read current Iread having shifted from the target read current Itar exceeds the write current, the magnetization in the free layer 101 of the magnetoresistive element 1 may reverse.

To avoid disturbance, therefore, the read current Iread must be strictly controlled in the state in which disturbance can occur. On the other hand, in the state in which no disturbance can occur, no problem arises even if the read current Iread largely fluctuates.

Accordingly, the resistance state of the replica magnetoresistive element 53 is fixed to the state in which the read current Iread can be strictly controlled in the case that disturbance can occur. More specifically, as shown in FIG. 5, the replica magnetoresistive element 53 is fixed to the low-resistance state when the direction of the read current Iread is the same as the direction of a write current $I_{WH}$ that sets the magnetoresistive element 1 in the high-resistance state.

Figure 6:
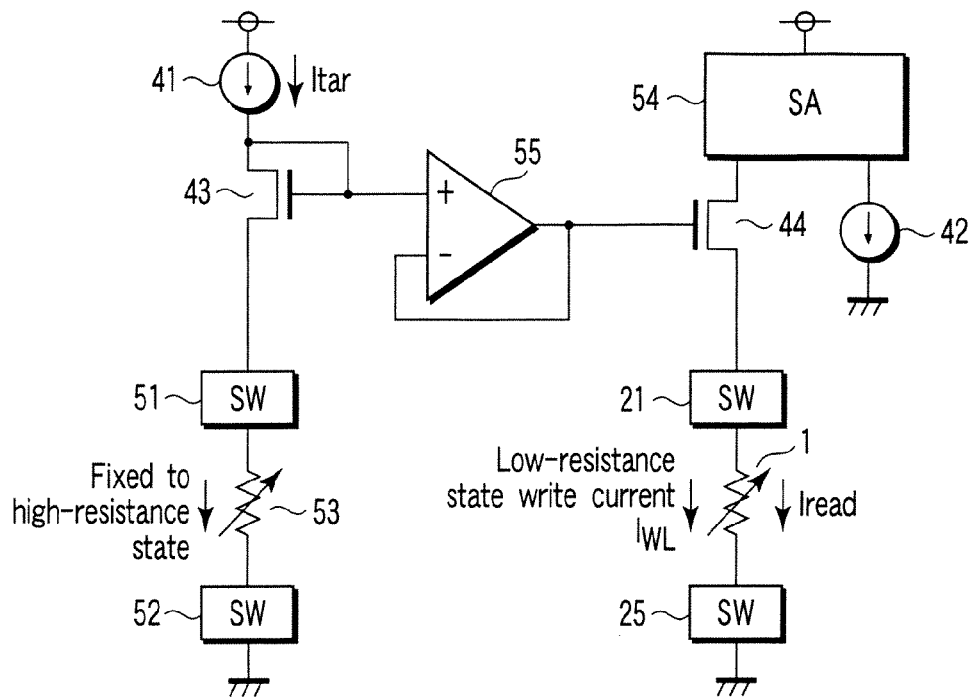
FIG. 6 is a diagram showing an example of fixing of the resistance state of the replica magnetoresistive element according to the first embodiment.

On the other hand, as shown in FIG. 6, the replica magnetoresistive element 53 is fixed to the high-resistance state when the direction of the read current Iread is the same as the direction of a write current $I_{WL}$ that sets the magnetoresistive element 1 in the low-resistance state.

By fixing the held data (resistance state) of the replica magnetoresistive element 53 as described above, the read current Iread can be strictly controlled in at least the state in which disturbance can occur. That is, the read current Iread having substantially the same value as that of the target read current Itar can be supplied to the magnetoresistive element 1.

This reduces the variation in read current Iread, facilitates setting the target read current Itar, and increases the design margin.

In the magnetic memory device according to the first embodiment, the replica magnetoresistive element 53 in the circuit for supplying the read current Iread to the magnetoresistive element 1 is fixed to the resistance state opposite to that which the magnetoresistive element 1 takes when the write current in the same direction as that of the read current Iread is supplied. Since this reduces limitations imposed on design, it is possible to implement a magnetic memory device having a peripheral circuit suited to the spin injection write method.

The first embodiment controls the value of the read current by using an electric current. By contrast, the second embodiment uses a voltage.

Figure 7:
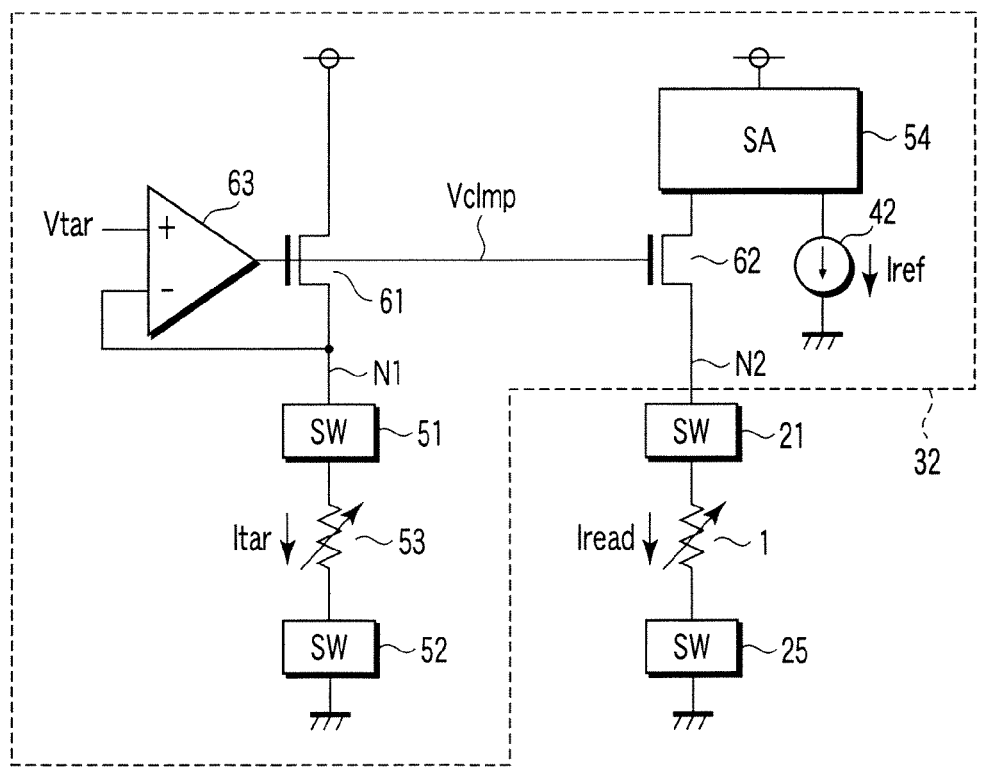
FIG. 7 is a circuit diagram of a magnetic memory device according to the second embodiment.

FIG. 7 shows the configuration of a circuit related to read of a magnetic memory device according to the second embodiment of the present invention. More specifically, FIG. 7 shows elements pertaining to read of one given memory cell 11. Note that the overall arrangement of the magnetic memory device of the second embodiment except for this configuration shown in FIG. 7 is the same as the first embodiment (FIGS. 1 and 2).

As shown in FIG. 7, a read circuit 32 according to the second embodiment includes a constant-current circuit 42, n-type MOSFETs 61 and 62, switching circuits 51 and 52, a replica magnetoresistive element 53, a sense amplifier 54, an operational amplifier 63, and the like.

A target read voltage Vtar is supplied to the non-inverting input terminal of the operational amplifier 63. The target read voltage Vtar is determined such that a target read current Itar flows through the replica magnetoresistive element 53.

The output terminal of the operational amplifier 63 is connected to the gate terminals of the transistors 61 and 62. The transistor 61 has one terminal (a drain terminal) that receives the power supply voltage, and the other terminal (a source terminal) connected to the switching circuit 51 and the inverting input terminal of the operational amplifier 63.

The transistor 62 has one terminal (a drain terminal) connected to the sense amplifier 54, and the other terminal (a source terminal) connected to a switching circuit 21. The transistors 61 and 62 have the same current drivability. Elements except for those explained in the second embodiment are the same as in the first embodiment (FIG. 3).

In this configuration shown in FIG. 7, as in the current mirror circuit, the target read current Itar determined in accordance with the target read voltage Vtar flows through the replica magnetoresistive element 53 and a magnetoresistive element 1. When the operational amplifier 63 is in a steady state, the target read voltage Vtar is applied between the ground and a node N1, and between the ground and a node N2. When the resistance values of the replica magnetoresistive element 53 and magnetoresistive element 1 are (substantially) the same, the voltage Vtar allows a read current Iread having the same value as that of the target read current Itar to flow through the magnetoresistive element 1. On the other hand, when the resistance values of the replica magnetoresistive element 53 and magnetoresistive element 1 are different, the read current Iread is different from the target read current Itar.

Figure 8:
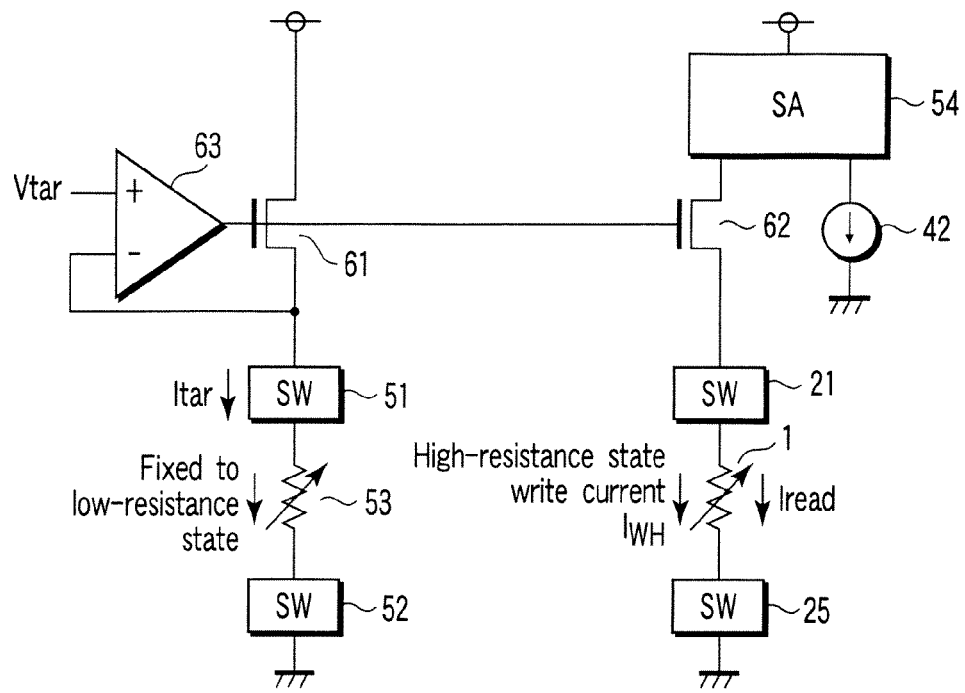
FIG. 8 is a diagram showing an example of fixing of the resistance state of a replica magnetoresistive element according to the second embodiment.

In the second embodiment, as in the first embodiment, the resistance state of the replica magnetoresistive element 53 is fixed to the state in which the read current Iread can be strictly controlled in the case that disturbance can occur. More specifically, as shown in FIG. 8, the replica magnetoresistive element 53 is fixed to the low-resistance state when the direction of the read current Iread is the same as that of a write current that sets the magnetoresistive element 1 in the high-resistance state.

Figure 9:
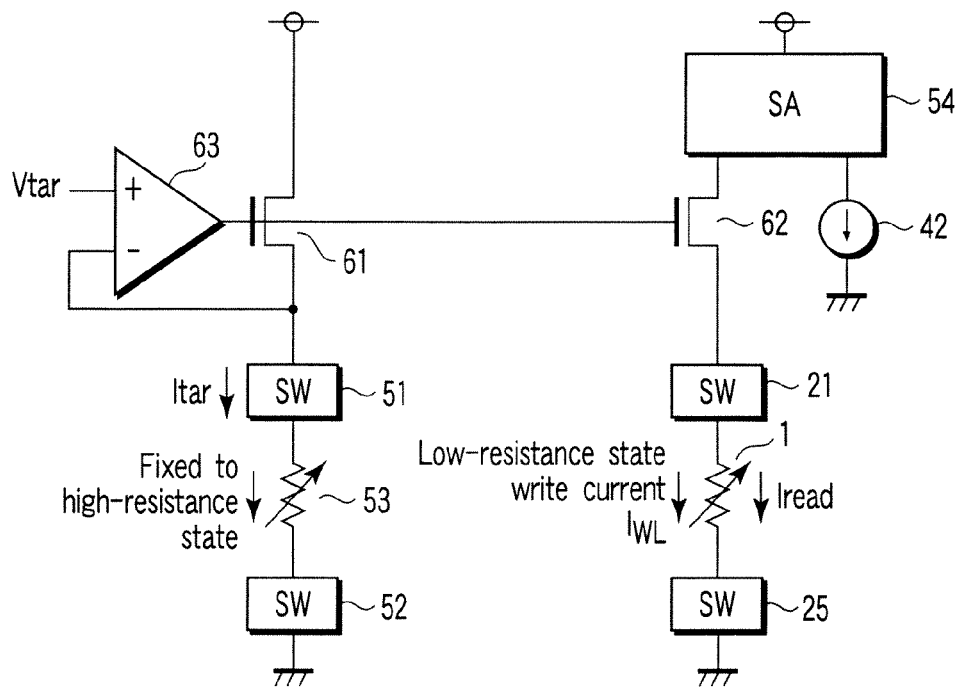
FIG. 9 is a diagram showing an example of fixing of the resistance state of the replica magnetoresistive element according to the second embodiment.

On the other hand, as shown in FIG. 9, the replica magnetoresistive element 53 is fixed to the high-resistance state when the direction of the read current Iread is the same as that of a write current that sets the magnetoresistive element 1 in the low-resistance state. As a consequence, the same effects as in the first embodiment are obtained.

In the magnetic memory device according to the second embodiment, as in the first embodiment, the replica magnetoresistive element 53 in the circuit for supplying the read current Iread to the magnetoresistive element 1 is fixed to the resistance state opposite to that which the magnetoresistive element 1 takes when the write current in the same direction as that of the read current Iread is supplied. Therefore, the same effects as in the first embodiment are obtained.

This embodiment can provide a magnetic memory device having a peripheral circuit suited to the spin injection write method.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A magnetic memory device comprising:
a first magnetoresistive element which takes a high-resistance state when receiving a write current in a first direction, takes a low-resistance state having a resistance value lower than a resistance value in the high-resistance state when receiving a write current in a second direction opposite to the first direction, and receives a read current in a read operation;
a second magnetoresistive element which takes one of the high-resistance state and the low-resistance state in accordance with a magnetization state thereof, is fixed to the low-resistance state when a direction of the read current is the same as the first direction, and is fixed to the high-resistance state when the direction of the read current is the same as the second direction; and
a control circuit which is connected to the first magnetoresistive element and the second magnetoresistive element, and makes a read voltage applied to the first magnetoresistive element equal to a read voltage applied to the second magnetoresistive element.

2. The device according to claim 1, wherein the first magnetoresistive element and the second magnetoresistive element have combinations of identical films, and have the same shape.

3. The device according to claim 1, wherein the first magnetoresistive element and the second magnetoresistive element include a fixed layer made of a ferromagnetic material, an interlayer made of a nonmagnetic material, and a free layer made of a ferromagnetic material.

4. The device according to claim 1, wherein the control circuit includes an operational amplifier.

5. A magnetic memory device comprising:
a first MOSFET having one terminal which receives a constant current, and a gate terminal connected to said one terminal;
a second MOSFET having one terminal connected to a sense amplifier, and a gate terminal which receives the same potential as a potential at the gate terminal of the first MOSFET;
a first magnetoresistive element which is connected the other terminal of the second MOSFET, takes a high-resistance state when receiving a write current in a first direction, takes a low-resistance state having a resistance value lower than a resistance value in the high-resistance state when receiving a write current in a second direction opposite to the first direction, and receives a read current in a read operation; and
a second magnetoresistive element which is connected to the other terminal of the first MOSFET, takes one of the high-resistance state and the low-resistance state in accordance with a magnetization state thereof, is fixed to the low-resistance state when a direction of the read current is the same as the first direction, and is fixed to the high-resistance state when the direction of the read current is the same as the second direction.

6. The device according to claim 5, wherein the first magnetoresistive element and the second magnetoresistive element have combinations of identical films, and have the same shape.

7. The device according to claim 5, wherein the first magnetoresistive element and the second magnetoresistive element include a fixed layer made of a ferromagnetic material, an interlayer made of a nonmagnetic material, and a free layer made of a ferromagnetic material.

8. The device according to claim 5, wherein the first MOSFET and the second MOSFET have the same current drivability.

9. A magnetic memory device comprising:
an operational amplifier having a non-inverting input terminal which receives a constant voltage;
a first MOSFET connected to an inverting input terminal of the operational amplifier, and having a gate connected to an output terminal of the operational amplifier;
a second MOSFET having one terminal connected to a sense amplifier, and a gate terminal connected to the output terminal of the operational amplifier;
a first magnetoresistive element which is connected the other terminal of the second MOSFET, takes a high-resistance state when receiving a write current in a first direction, takes a low-resistance state having a resistance value lower than a resistance value in the high-resistance state when receiving a write current in a second direction opposite to the first direction, and receives a read current in a read operation; and
a second magnetoresistive element which is connected to the other terminal of the first MOSFET, takes one of the high-resistance state and the low-resistance state in accordance with a magnetization state thereof, is fixed to the low-resistance state when a direction of the read current is the same as the first direction, and is fixed to the high-resistance state when the direction of the read current is the same as the second direction.

10. The device according to claim 9, wherein the first magnetoresistive element and the second magnetoresistive element have combinations of identical films, and have the same shape.

11. The device according to claim 9, wherein the first magnetoresistive element and the second magnetoresistive element include a fixed layer made of a ferromagnetic material, an interlayer made of a nonmagnetic material, and a free layer made of a ferromagnetic material.

12. The device according to claim 9, wherein the first MOSFET and the second MOSFET have the same current drivability.

* * * * *